United States Patent
Go et al.

(10) Patent No.: US 6,867,855 B2
(45) Date of Patent: Mar. 15, 2005

(54) METHOD OF AND APPARATUS FOR DETECTING A DEFECT AT THE OUTER PERIPHERAL EDGE OF A WAFER, AND CLEANING EQUIPMENT COMPRISING THE APPARATUS

(75) Inventors: Seung-Jae Go, Suwan (KR); In-Suk Lee, Hwasung-Gun (KR); Tae-Jun Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 216 days.

(21) Appl. No.: 10/356,479

(22) Filed: Feb. 3, 2003

(65) Prior Publication Data

US 2004/0004713 A1 Jan. 8, 2004

(30) Foreign Application Priority Data

Jul. 8, 2002 (KR) .................................. 2002-0039390

(51) Int. Cl.$^7$ ........................... G01N 21/00; G01B 7/16
(52) U.S. Cl. ..................................... 356/237.1; 73/781
(58) Field of Search ........................ 356/237.1–237.4, 356/614, 625; 73/763, 781

(56) References Cited

U.S. PATENT DOCUMENTS

| 4,409,087 | A | * | 10/1983 | Quick | ................... 204/298.03 |
| 5,690,744 | A | * | 11/1997 | Landau | ....................... 118/715 |
| 5,970,807 | A | * | 10/1999 | Hsu et al. | ................... 73/865.9 |
| 6,101,868 | A | | 8/2000 | Hung et al. | |

* cited by examiner

Primary Examiner—Michael P. Stafira
(74) Attorney, Agent, or Firm—Volentine Francos & Whitt P.L.L.C.

(57) ABSTRACT

Apparatus for detecting a defect in the outer peripheral edge of a wafer includes a rotary mechanism by which the wafer can be rotated, a wafer edge contact device, and a controller. The wafer edge contact device includes a string that is pressed against the edge of the wafer. One end of the string is fixed in place, and a sensor is operatively associated with the other end of the string so as to sense movement of the other end of the string. This other end of the string will be pulled by a defect at the outer peripheral edge of the wafer when the wafer is rotated. Thus, a defective edge of the wafer can be detected before/after the wafer is processed. Accordingly, the wafer can be prevented from being further damaged, wafer particles are prevented from polluting the fabricating equipment, and the operating efficiency and productivity of the fabricating equipment are enhanced.

13 Claims, 2 Drawing Sheets

US 6,867,855 B2

METHOD OF AND APPARATUS FOR DETECTING A DEFECT AT THE OUTER PERIPHERAL EDGE OF A WAFER, AND CLEANING EQUIPMENT COMPRISING THE APPARATUS

BACKGROUND OF THE INVENTION

1. Field of the Invention

The present invention relates to the detection of defects in a semiconductor wafer. More particularly, the present invention relates to the detecting of damage at the outer peripheral edge of the wafer before/after the wafer is processed. The present invention also relates to the inspection of a semiconductor wafer before and/or after the wafer is cleaned.

2. Description of the Related Art

In general, semiconductor devices are fabricated by selectively and repetitively subjecting a wafer to such processes as photolithography, etching, diffusion, chemical vapor deposition (CVD), ion implantation and metal evaporation processes. More specifically, the manufacturing of the semiconductor devices entails loading a plurality of wafers in a cassette, transferring the wafers to various fabricating apparatus in which the above respective processes are performed, aligning the wafers relative to the fabricating apparatus, processing the wafers in the apparatus, withdrawing the wafers from the apparatus using a robot, and then transferring the processed wafers to a predetermined position. In addition, the wafers must be placed in a stand-by state for certain amounts of time in the course of the above-described progression of respective processes.

Each wafer is also cleaned to eliminate from its surface certain substances such as foreign particles or a reactive outgrowth produced by the previous processes.

Also, only normal wafers among the respective wafers subjected to a certain unit process are allowed to proceed to the next process. Thus, inferior or damaged wafers must be detected.

Further in this respect, the edge of a wafer is typically weak and experiences many impacts with the cassette fabricating equipment. Thus, the edge of a wafer is frequently slightly damaged. However, none of the detecting apparatus are capable of discriminating such a damaged state of a wafer. As a result, wafers damaged or broken in this way are not detected and rejected but are transferred to the next process together with the normal wafers.

The damage at the edge of the wafers gradually increases due to the pressure under which the following process is carried out, the heat that is generated in the equipment or further collisions with other components of the equipment, etc. As a result, the damaged edge of the wafer breaks up into small particles. These particles can cause other wafers to become damaged and pollute the fabricating equipment. This, in turn, requires the fabricating equipment to be repaired and/or cleaned, thereby lowering the operating efficiency of the fabricating equipment.

In an attempt to overcome such problems, the outer edge of the wafer is inspected by eye or using an optical device such as a microscope. However, such inspection procedures require much working time and are not highly reliable.

Furthermore, another conventional technique to check for damage at the edge of the wafer involves irradiating the edge portion of the wafer while the wafer is rotated, detecting the intensity of the light that disperses from the edge portion of the wafer, and determining whether the wafer is damaged based on the detected intensity of the dispersed light. In this technique, the wafers must be aligned and rotated in correspondence with the irradiation of the inspection light. However, in this technique, the manner in which the wafer is supported, and the curved surface at the edge of the wafer make it difficult to measure the intensity of the dispersion light with a high degree of reliability.

SUMMARY OF THE INVENTION

Therefore, it is an object of the present invention to provide a wafer edge defect detecting apparatus that can easily and reliably check for damage at the edge portion of a wafer, whereby a decision can be made as to whether the wafer is to be further processed or accepted.

In accordance with one aspect of the present invention, an apparatus for detecting an edge defect of a wafer comprises a rotary mechanism in the form of a vacuum chuck for chucking and rotating a wafer, a wafer edge contact device for contacting the edge of the wafer while the wafer is being rotated to detect for damage at the edge of the wafer, and a controller.

The wafer detecting device includes a string an intermediate length of which is freely supported, a string support to which one end of the string is fixed, and a sensor operatively associated with the other end of the string. The sensor is operative to sense movement of the string and to produce signals indicative of the extent to which the length of the string is displaced. The intermediate length of the string can be placed in contact with an outer peripheral edge of a wafer adhered to the vacuum chuck. Accordingly, the string will be pulled by a defect at the outer peripheral edge of the wafer when the wafer is rotated.

The controller receives signals produced by the sensor and, accordingly, controls the operation of respective parts of the apparatus such as the chuck assembly and the wafer edge contact device.

In accordance with another aspect of the present invention for achieving the objects, an apparatus for detecting an edge defect of a wafer can be integrated with a wafer alignment device comprising a wafer cassette, and a rotary mechanism in the form of at least one rotary shaft which contacts lower parts of the wafers exposed at the bottom of the cassette and rotates the wafers within the cassette. In this case, the wafer edge contact device includes, in addition to the features described above, a plurality of supporting dies each of which has a free end and a through-hole in the free end, and a sensor block supporting the dies such that the dies are tiltable relative to the block.

The sensor block is operative to sense the relative degree of inclination of the respective supporting dies and produce signals indicative of the respective degrees of relative inclination thereof. The intermediate length of string extends through the through-holes in the free ends of the supporting dies. The controller is operatively connected to the sensor block so as to receive the signals produced by the sensor block, in addition to those signals produced by the sensor associated with the end of the string.

In accordance with still another aspect of the present invention, an apparatus for detecting an edge defect of a wafer can be integrated with cleaning equipment. In this case, a rotary mechanism for rotating a wafer comprises a rotary vacuum chuck. A brush assembly is disposed over the chuck for supplying a cleansing solution onto an upper surface of the wafer adhered to the chuck. The brush assembly also includes a rotating brush for brushing the upper surface of the wafer with the cleansing solution. A wafer edge contact device, similar to that described in connection with the first aspect of the present invention, contacts the edge of the wafer to check for damage at the edge portion before and/or after the upper surface of the wafer is cleaned by the brush assembly.

In operation, and according to yet another aspect of the present invention, the controller controls the wafer edge contact device to move such that the freely supported intermediate length of string contact the edge of the wafer while the one end of the string is fixedly supported and the other end of the string has a load exerted thereon. Then the wafer is rotated at a given speed, preferably 0.2~5 rpm. Subsequently, the sensor detects when the string is pulled against the load exerted on the string by a defect at the outer peripheral edge of the wafer. At this time, an image may be taken of that portion of the peripheral edge of the wafer that pulls the string such that the presence of the defect can be confirmed and/or the form of the defect can be discerned.

BRIEF DESCRIPTION OF THE DRAWINGS

The above and other objects and features of the present invention will become apparent from the following description of preferred embodiments taken in conjunction with the accompanying drawings, of which.

DETAILED DESCRIPTION OF THE PREFERRED EMBODIMENTS

Hereinafter, the preferred embodiments of the present invention will be described in detail with reference to the accompanying drawings.

Figure 1:
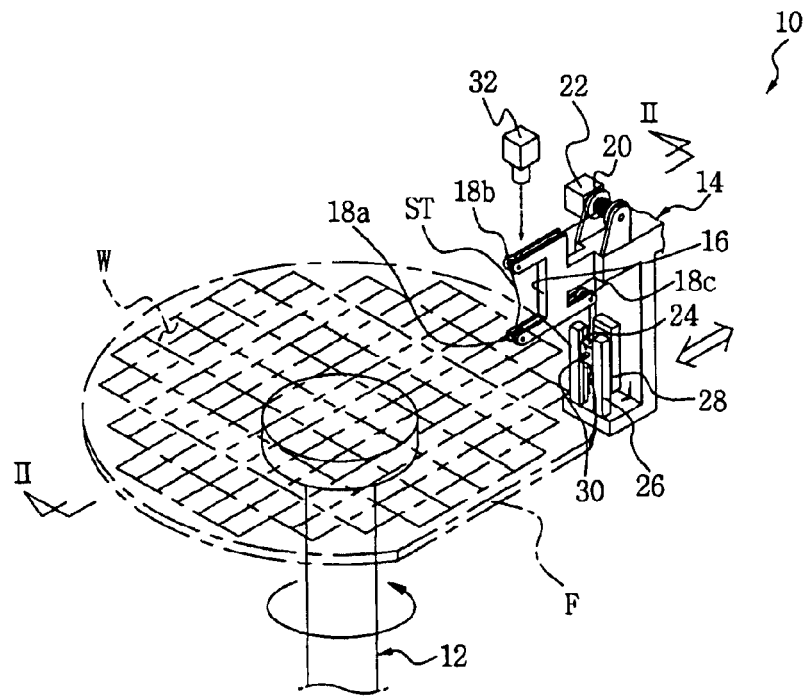
FIG. 1 is a perspective view of one embodiment of a wafer edge defect detecting apparatus in a semiconductor device fabricating facility according to the present invention.

As shown in FIG. 1, a wafer edge defect detecting apparatus 10 includes a chuck assembly 12, and a wafer edge contact device 14. The chuck assembly 12 comprises a vacuum chuck that generates suction to fix the wafer W in place thereon. The wafer edge contact device 14 is disposed to one side of the chuck assembly and can be constructed so as to be movable linearly towards the chuck assembly 12 from one side of the chuck assembly 12, or to first be swingable into position at one side of the chuck assembly 12.

The wafer edge contact device 14 comprises a string ST, a main body 16, a string guide section 18 that guides the string ST so that one length of the string ST extends in a vertical plane, a string support 22, and a sensor comprising a signal generator 24 and a signal receiver 28.

The main body 16 defines a concavity into which the supported string ST may flex while in contact with the outer peripheral edge of the wafer W. The extent to which the wafer edge contact device 14 can be slid towards the chuck assembly 12 is limited based on the diameter of the wafer W and the degree to which the string ST is to contact the wafer W.

The string guide section 18 of the wafer contact device 14 includes at least one roller 18a, 18b, 18c supporting the string ST such that the string ST is free to move in its lengthwise direction—including that part of the string ST that extends vertically adjacent the edge of the wafer W. To this end, the at least one roller 18a, 18b, 18c is rotatably supported on the body 16 of the wafer edge contact device 14. More specifically, a first roller 18a is rotatably supported by the body 16 at the bottom of the concavity defined by the body 16, and a second roller 18b is rotatably supported by the body 16 at the top of the concavity. At least one other roller 18c can be provided to support the string ST between the string support 22 and the signal generator 24.

The string support 22 is fixed to one end of the string ST. The support 22 preferably comprises a take-up mechanism 20 disposed on top of the main body 16 of the wafer edge contact device 14. The take-up mechanism 20 supports one end of the string ST and pulls on the string with a small biasing force, whereby the string ST is under tension. The biasing force exerted by the take-up mechanism 20 is sufficient to prevent an upper surface of the wafer W from being scratched by an end portion of the string ST in the case wherein the string ST is severed by a damaged portion of the edge the wafer W.

In view of this potential problem, more than one piece of the string ST may contact the outer peripheral edge of the wafer W at a time, or respective pieces of the string ST can be selectively placed in contact with the wafer W. In the latter case, the cut piece of string can be replaced when the string ST is cut in the midst of the inspection process.

The above-mentioned sensor of the wafer edge contact device 14 is disposed adjacent one side of the string ST for sensing the extent to which the string ST is pulled by the rotating wafer W. As will be described later on in connection with the operation of the apparatus, the string ST may be pulled by an edge portion of the wafer W that is damaged or has a build-up of foreign particles. The sensor applies a signal indicative of this state to a controller CU.

To this end, the signal generator 24 of the sensor is fixed to an end of the string ST so as to be slid up or down according to the state of contact between the string ST and the wafer. The signal generator is operative to output a signal irrespective of its position. On the other hand, the signal receiver 28 includes a number of parts which are arranged alongside the direction of movement of the signal generator 24. The signal receiver 28 senses the signal output by the signal generator 24, produces a signal indicative of the relative position of the signal generator 24, and transmits its signal to the controller CU. Accordingly, the signal generator 24 and signal receiver 28 may comprise a photo-coupler, i.e. a pair of cooperating photo elements in the form of a light generator and a light receiver, a magnetic sensor, a switch assembly including a plurality of connection terminals, or a sensor unit using a diaphragm.

The signal generator 24 may be mounted to a fixing member 30. Although the fixing member 30 is supported loosely enough to allow the signal generator 24 to move up and down, the fixing member 30 allows the signal generator 24 to be positioned if the string ST is cut by the edge of the wafer W. A guide 26 guides the fixing member 30 and limits the range of sliding movement of the signal generator 24. That is, the guide 26 keeps the signal generator 24 across from the signal receiver 28 during the course of its sliding movement.

Also, as shown in FIG. 1, the signal generator 24 is freely suspended by the string ST. However, an elastic member such as a spring may be used to restore the signal generator 24 to a home position.

The above-mentioned parts of the signal receiver 28 arranged alongside the direction of movement of the signal generator 24 include a normal state block A where the signal generator 24 is positioned when the string ST contacts the wafer W normally, an initial state block B where the signal generator 24 is positioned when the string ST is not in contact with the wafer W, and an abnormal state block C where the signal generator 24 is positioned when the string ST is pulled by being hooked onto an edge portion of the rotating wafer W.

Each block A, B, C is also subdivided into a plurality sections. In the normal state block A, the subdivisions include a section where the signal generator 24 is positioned when the string ST contacts a flat-zone of the wafer W. In the initial state block B, the subdivisions include a section where the signal generator 24 is normally positioned while the string ST is not in contact with the wafer W, and a section where the signal generator is located 24 when the string ST is cut. In the abnormal state block C, the subdivisions include a section where the signal generator 24 is located when the string ST is pulled by being hooked onto a damaged portion of the wafer W or a portion on which pollutants have been deposited.

The wafer edge damage detecting apparatus 10 also preferably comprises an optical imaging device 32 (hereinafter "optical unit"), such as a camera, disposed above the chuck assembly 12 and, in particular, above the location where the edge of wafer W will be located when fixed to the chuck assembly 12. The optical unit 32 is connected to the controller CU so that the position of the flat-zone of wafer W can be ascertained or so that the cause of the movement of the string can be clarified. For instance, the optical unit 32 can be used to clarify whether the string ST is being pulled by a damaged edge portion of the wafer W or by an adhesive force of pollutants deposited on an edge portion of the wafer or by merely a collision of the string with a protuberance at the edge portion of the wafer. Also, the optical unit 32 may be used for checking whether the wafer W is disposed eccentrically with respect to the rotational axis of the chuck assembly 12.

Next, the operation of the wafer edge damage detecting apparatus 10 will be described. Before a wafer W is processed, the wafer W is transferred to the apparatus 10 by a conventional transfer unit. The controller CU controls the transfer unit so that the center of the bottom surface of the wafer W is placed on the chuck assembly 12 whereupon the wafer W is adhered by suction to the chuck assembly 12. Note, the center of the wafer W is aligned as close as possible with the axis of rotation of the chuck assembly 12.

The controller CU subsequently moves the wafer edge contact device 14 towards the chuck assembly 12 until the vertical section of the string ST contacts the outer peripheral edge of the wafer W adhered to the chuck assembly 12. At this time, the supported portion of the string ST in contact with the wafer W is bent at a given angle. Accordingly, the signal generator 24 fixed to the end of the string ST moves from the initial state block B to the normal state block A. That is, the controller CU controls the movement of the wafer edge contact device 14 to position the signal generator 24 on a predetermined section of the normal state block A.

Then, the chuck assembly 12 rotates at a speed of about 0.2~5 rpm in response to a control signal applied thereto by the controller CU. At this time, the state of contact between the string ST and the arcuate and flat-zones of the wafer W is maintained. Accordingly, the signal generator 24 is positioned adjacent the uppermost section of the normal state block A when the string ST is in contact with the arcuate outer edge portion of the wafer W. On the other hand, the signal generator 24 is positioned adjacent the lowermost section of the normal state block A when the string ST is in contact with the flat-zone of the wafer W.

Now, if a portion of the outer peripheral edge of the wafer W is damaged or otherwise defective, the string ST will hook onto that portion, and will be pulled in the direction of rotation of the wafer W. At this time, the signal generator 24 moves from the uppermost section of the normal state block A to the abnormal state block C situated above the normal state block A. The signal receiver 28 discriminates the change in position of the signal generator 24 and issues a respective corresponding signal to the controller CU.

If the edge of the wafer W is damaged at the flat-zone of the wafer W, the signal generator 24 will not be positioned adjacent the lower section of the normal state block A, i.e., the section that the signal generator 24 confronts when the string is against an undamaged flat-zone. Therefore, a signal to that effect is transmitted to the controller.

Hence, the controller CU checks whether the outer edge of the wafer W is broken or otherwise damaged, or whether an adhesive pollutants have been deposited at the edge. The chuck assembly 12 is stopped if any of such conditions are determined by the controller to exist. Simultaneously, the abnormal edge portion of the wafer W is viewed by the optical unit 32. At the same time, the image of the edge portion of the wafer W captured by the optical unit 32 is outputted to a display unit DU, such as a monitor, so that the presence of the defect can be confirmed by a technician.

The wafer defect detecting apparatus 10 also preferably includes an indicator IU connected to the controller CU so that the technician is instantly and readily made aware that the sensor is indicating that the string ST is being pulled. The indicator IU may be an audio alarm or a light display. Still further, the controller CU may comprise a switch for selectively cutting off power to respective components of the equipment including the chuck assembly 12 and the wafer edge contact device 14 at the same time as or in lieu of the activation of the indicator IU.

As per the above, if the presence of a defect at the edge of the wafer W is confirmed, the controller CU controls the wafer edge contact device 14 to move away from the chuck assembly 12 and controls the chuck assembly 12 such that it becomes freely rotatable. At the same time, the controller CU controls the transfer unit to transfer the wafer W from the chuck assembly 12 to an analysis position where the cause of the damage or defect can be determined. Note, the chuck assembly 12 is made freely rotatable to the assembly to be returned to the very position at which the string ST became hooked onto the wafer W. Otherwise, the string ST may be cut when the wafer edge contact device 14 is moved away from the chuck assembly 12 while the string ST is still hooked onto the damaged portion of the wafer W.

Furthermore, if the string ST is cut while in contact with the wafer W, a determination is made as to whether the cutting of the string ST was caused merely due to continuous prolonged contact between the string ST and the wafer W or due to a broken or otherwise damaged portion of the wafer. Also at this time, the take-up mechanism 20 of the support 22 is driven or operates to take up the severed end of the string ST and thereby prevent an upper part of the wafer W from being damaged by the severed end.

Figure 2:
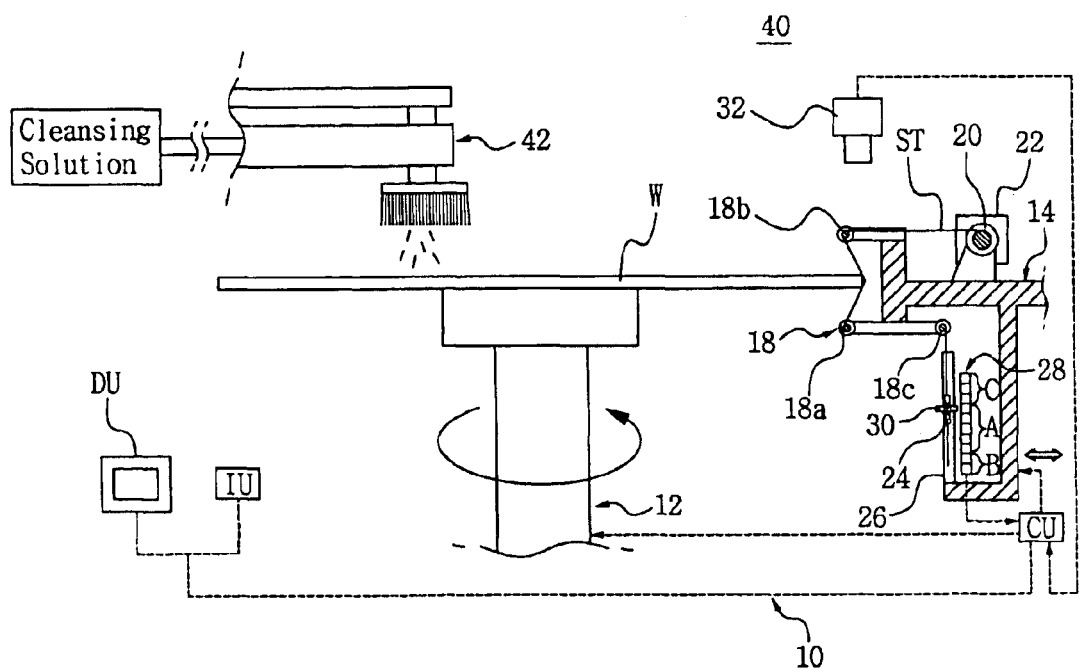
FIG. 2 is a sectional view of the apparatus as taken along line II—II of FIG. 1, along with a brush assembly that can be used in conjunction therewith.

The wafer edge defect detecting apparatus 10 of the present invention may be employed by wafer cleaning equipment 40, as shown in FIG. 2. The equipment comprises a brush assembly 42 which is selectively positioned to contact the upper surface of the wafer W adhered to the chuck assembly 12. The brush assembly 42 is operative to supply a cleansing solution onto the upper surface of the wafer W and to simultaneously rotate a brush against the upper surface.

In operation, the wafer W to be cleaned is mounted on the chuck assembly 12. The wafer edge contact device 14 is then driven to place the string ST in contact with the outer peripheral edge of the wafer W, and the chuck assembly 12 is then rotated at a speed of about 0.2~5 rpm. The controller CU then checks whether the edge of the wafer W has a defect in the manner described in detail above. If the technician confirms the existence of a defect from the information provided by the controller CU, the wafer W is transferred from the apparatus without being cleaned. Otherwise, the wafer edge contact device 14 is moved away from the wafer W. Subsequently, the chuck assembly 12 is rotated at a high speed and simultaneously the brush assembly 42 is positioned proximate the upper surface of the wafer W to execute the cleaning of the wafer W. In addition, the wafer edge inspecting procedure may be performed after the cleaning process, as well.

Next, another embodiment of a wafer edge defect detecting apparatus 50 in accordance with the present will be described with reference to FIGS. 3 and 4.

The wafer edge defect detecting apparatus 50 comprises a wafer cassette WC having slots S that accommodate a plurality of wafers W, respectively, while exposing respective portions of the wafers W at the bottom thereof, at least one rotary shaft R for contacting and rotating the exposed portions of the wafers W at the bottom of the cassette WC, and a wafer edge contact device 14'.

The wafer edge contact device 14' includes a plurality of supporting dies 52 each of which projects into the space between a respective pair of wafers W, and a sensor block from which the dies 52 extend vertically. The upper ends of the supporting dies 52 have a through-hole (h), and the through-holes (h) are aligned in the direction in which the wafers W are arrayed in the wafer cassette WC.

Figure 3:
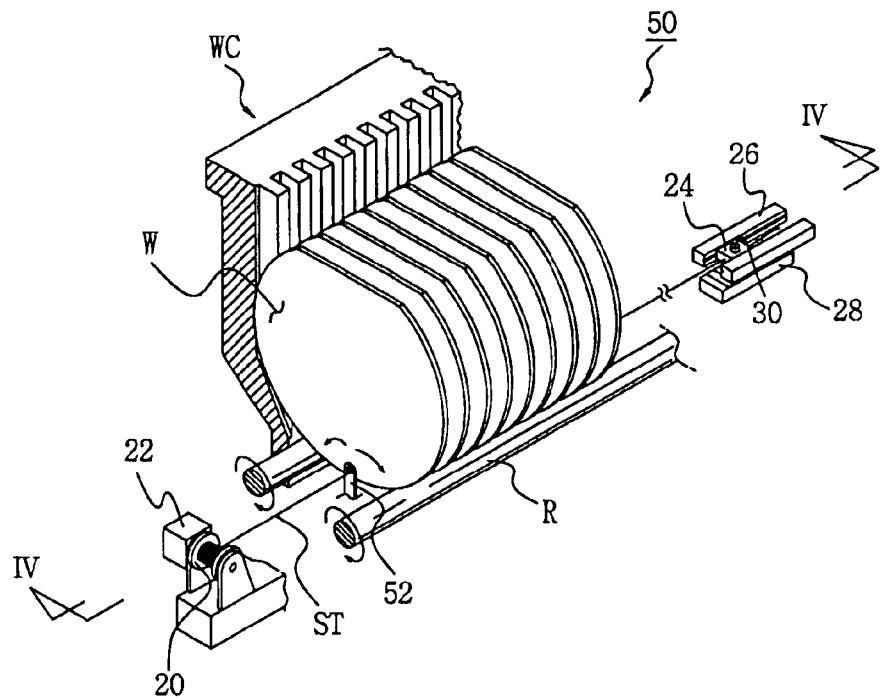
FIG. 3 is a partially cut-away perspective view of another embodiment of a wafer edge defect detecting apparatus in accordance with the present invention.
Figure 4:
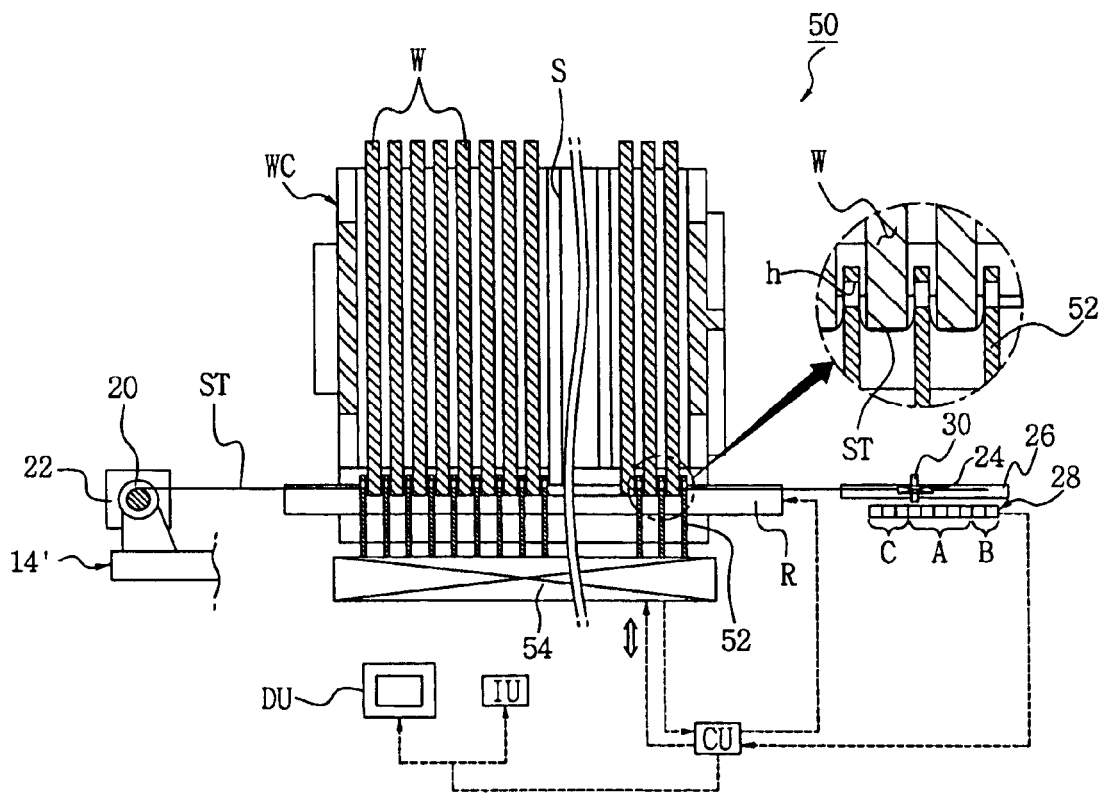
FIG. 4 is a sectional view of the wafer edge defect detecting apparatus as taken along line IV—IV of FIG. 3.

The sensor block 54 supports the dies 52 in a resilient manner such that the dies are tiltable over a given angle in the directions shown by the arrows in FIG. 3. Also, the sensor block 54 is operative to sense each angle of inclination of the respective supporting dies 52, and to sends signals indicative of these angles to the controller CU. Still further, the sensor block 54 is constructed so as to be movable upwards and downwards while supporting the supporting dies 52.

A given length of the string ST is passed through the through-holes (h) of the respective supporting dies 52. One end the string ST is supported by the string support 22 at one side of the wafer cassette WC, and the opposite end of the string ST is connected to the sensor which is disposed at the other side of the cassette WC. The string support 22 and the sensor have the same structure and operation as the as those described in connection with the embodiment of FIGS. 1 and 2. For instance, although not shown in FIGS. 3 and 4, an elastic member such as a spring may be used to bias the signal generator 24 of the sensor to a home position. Furthermore, although the sensor is shown as oriented horizontally in FIGS. 3 and 4, the wafer edge contact device 14' may employ at least one guide roller (corresponding to 18a, 18b and/or 18c but not shown in the figures for the sake of simplicity) for the string ST so that the sensor can be oriented vertically as in the embodiment of FIGS. 1 and 2.

The operation of this apparatus 50 begins with a stand-by procedure in which the plurality of wafers W mounted in the cassette WC are transferred to a piece of fabricating equipment and are readied for processing therein. At this time, the wafers W are supported by the rotary shafts R, and are placed in contact with the length of string ST that passes through the through-holes (h) of the supporting dies 52. Thus, the signal generator 24 of the sensor moves from the initial state block B to the normal state block A of the signal receiver 28 under the force exerted on the string ST by the wafers W. The controller CU receives corresponding signals from the sensor, namely, from the signal receiver 28 until the controller CU determines that the wafers W have been set correctly against the string ST for the inspection process. The controller CU then rotates the rotary shafts R.

Herewith, the wafers W mounted on the cassette WC must first have their flat-zones aligned. If the wafers W are set in the cassette without their flat-zones being aligned, the controller CU controls sensor block 54 and the rotary shafts R such that the shafts R rotate within a limited range while the string ST is not in contact with the wafer W. In this state, the wafers W are drop-positioned in the slots S, thereby aligning the flat-zones of the wafers W. Then the wafers W can be subjected to the edge defect detecting procedure.

In such a procedure, the wafers W are rotated within the respective slots S by the rotary shafts R. If the edge of any of the wafers is damaged or adhesive pollutants have been deposited on an edge of the wafer W, the string ST is hooked thereon. At this time, both supporting dies 52 at the sides of that portion of the string ST hooked onto a wafer are tilted in the direction of rotation of the wafers W, and the sensor block 54 senses the inclination of these supporting dies 52 and sends a corresponding signal to the controller CU. Simultaneously, the signal generator 24 of the sensor moves from the normal state block A to the abnormal state block C of the signal receiver 28, and then sends a signal corresponding to this result to the controller CU.

Based on these signals, the controller CU determines the slot of the cassette C that accommodates the wafer W having a defective edge. The defective wafer is indicated to the technician via display unit. The controller also stops the rotation of the rotary shaft R.

As described above in accordance with the present invention, the edge of a wafer can be inspected before and/or after a surface of the wafer is cleaned, in the midst of transferring the wafer W to processing equipment such as photolithography equipment, during a specific stand-by time in the course of the overall semiconductor fabrication process, or in the midst of a procedure of aligning the wafers in preparation for their introduction into a piece of fabricating equipment.

Also, the present invention makes it possible to readily and reliably confirm whether an edge portion of a wafer is damaged, whereby further damage to that or other wafers in the line can be prevented. Thus, the present invention is not only useful in preventing the pollution of the fabricating equipment, but also in enhancing the operating efficiency and productivity of the fabricating equipment.

Finally, various modifications and variations of the present invention will become apparent to those skilled in the art. Thus, all such modifications and variations that come within the scope of the appended claims are seen to be within the true spirit and scope of the present invention.

What is claimed is:

1. Apparatus for detecting a defect in the outer peripheral edge of a wafer, comprising:

a rotary mechanism by which the wafer can be rotated;

a wafer edge contact device disposed adjacent said rotary mechanism, said device including a string, a guide section that guides the string such that a length thereof is freely supported, a string support to which one end of the string is fixed, and a sensor operatively associated with the other end of said string so as to sense movement of said other end of the string when said length of the string is displaced and operative to produce signals indicative of the extent to which said length of string is displaced, and wherein said length of string can be placed in contact with an outer peripheral edge of a wafer readied in the apparatus for rotation by said rotary mechanism, whereby said string will be pulled by a defect at the outer peripheral edge of the wafer when the length of string is in contact with the outer peripheral edge and the wafer is rotated by said rotary mechanism; and a controller operatively connected to said sensor so as to receive the signals produced by said sensor.

2. The apparatus of claim 1, wherein said wafer edge contact device is movable to position said length of string against the outer peripheral edge of a wafer adhered to said rotary chuck, and said controller is operatively connected to said rotary mechanism so as to control the rotation of said wafer and to said wafer edge contact device so as to control the movement thereof.

3. The apparatus of claim 1, wherein said wafer edge contact device further includes a main body defining a concavity, and said guide section comprises rollers supported by said main body and disposed at opposite sides of said concavity.

4. The apparatus of claim 3, wherein said string support comprises a take-up mechanism that exerts a constant bias on said one end of the string.

5. The apparatus of claim 1, wherein said sensor comprises:

a signal generator fixed to said other end of the string so as to move therewith, and operative to constantly output a given signal, and a signal receiver disposed across from said signal generator, and operatively associated with said signal generator so as to receive the signal outputted from the signal generator and generate a signal indicative of the relative position of the signal generator.

6. The apparatus of claim 5, wherein said rotary mechanism is a rotary chuck oriented so as to be rotatable about a vertical axis, said signal generator is suspended by said other end of the string, said signal receiver extends vertically across from said signal generator, and wherein said wafer edge contact device further includes a vertically extending guide that guides said signal generator for vertical sliding movement, whereby said signal generator is maintained in position across from said signal receiver.

7. The apparatus of claim 1, and further comprising an optical imaging device positioned to capture an image of the outer peripheral edge of the wafer at a location where the string of said wafer edge contact device will contact the edge of the wafer.

8. The apparatus of claim 1, wherein said wafer edge contact device further includes a plurality of supporting dies each of which has a free end and a through-hole in said free end, and a sensor block supporting said dies such that the dies are tiltable relative to the block, said sensor block being operative to sense the relative degree of inclination of the respective supporting dies and produce signals indicative of the respective degrees of relative inclination thereof, said length of string extending through the through-holes in the free ends of said supporting dies, and said controller being operatively connected to said sensor block so as to receive the signals produced by said sensor block.

9. The apparatus of claim 8, wherein said sensor block is supported in the apparatus so as to be vertically movable.

10. Wafer cleaning equipment comprising:

a chuck assembly comprising a rotary wafer chuck to which a wafer can be adhered and by which the wafer can be rotated;

a brush assembly disposed above said chuck and including a cleansing solution supply that supplies cleansing solution onto an upper surface of a wafer adhered to the chuck, and a brush;

a wafer edge contact device disposed adjacent said rotary wafer chuck, said device including a string, a guide section that guides the string such that a length thereof is freely supported, a string support to which one end of the string is fixed, and a sensor operatively associated with the other end of said string so as to sense movement of said other end of the string when said length of the string is displaced and operative to produce signals indicative of the extent to which said length of string is displaced, and wherein said length of string can be placed in contact with an outer peripheral edge of a wafer adhered to said rotary chuck, whereby said string will be pulled by a defect at the outer peripheral edge of the wafer when the length of string is in contact with the outer peripheral edge and the wafer is rotated by said rotary chuck; and a controller operatively connected to said sensor so as to receive the signals produced by said sensor.

11. A method of detecting a defect in the outer peripheral edge of wafer, comprising:

moving a length of string into contact with the edge of the wafer while one end of the string is fixedly supported and the other end of the string has a load exerted thereon;

rotating the wafer at a given speed while the string is in contact with the edge of the wafer; and subsequently detecting when the string is pulled against the load exerted on the string by a defect at the outer peripheral edge of the wafer.

12. The method of claim 11, wherein said given speed is 0.2~5 rpm.

13. The method of claim 11, and further comprising capturing an image of that portion of the peripheral edge of the wafer that pulls the string at the time of said detecting.

* * * * *